United States Patent
Jung

(10) Patent No.: US 10,147,771 B2
(45) Date of Patent: Dec. 4, 2018

(54) ORGANIC LIGHT EMITTING DIODE DISPLAY

(71) Applicant: SAMSUNG DISPLAY CO., LTD., Yongin, Gyeonggi-Do (KR)

(72) Inventor: Sun-Kyo Jung, Cheonan-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 498 days.

(21) Appl. No.: 14/483,539

(22) Filed: Sep. 11, 2014

(65) Prior Publication Data

US 2015/0102320 A1 Apr. 16, 2015

(30) Foreign Application Priority Data

Oct. 16, 2013 (KR) .......................... 10-2013-0123510

(51) Int. Cl.
*H01L 29/08* (2006.01)
*H01L 27/32* (2006.01)
*H01L 51/52* (2006.01)

(52) U.S. Cl.
CPC ........ *H01L 27/3218* (2013.01); *H01L 51/525* (2013.01); *H01L 27/3216* (2013.01)

(58) Field of Classification Search
CPC ................................................... H01L 27/3218
USPC .......................................................... 257/40
See application file for complete search history.

(56) References Cited

U.S. PATENT DOCUMENTS

| | | | |
|---|---|---|---|
| 2007/0285414 A1* | 12/2007 | Lee | G09G 3/3233 345/212 |
| 2010/0033084 A1* | 2/2010 | Ko | H01L 27/3246 313/504 |
| 2011/0193478 A1 | 8/2011 | Kim | |
| 2011/0299002 A1* | 12/2011 | Won | G02B 5/201 349/43 |
| 2012/0049726 A1* | 3/2012 | Yoo | H01L 27/3213 313/504 |
| 2012/0068185 A1 | 3/2012 | Kim et al. | |
| 2012/0313123 A1* | 12/2012 | Kim | H01L 51/525 257/89 |
| 2013/0155347 A1* | 6/2013 | Yonemura | G02F 1/133308 349/58 |

FOREIGN PATENT DOCUMENTS

| | | | |
|---|---|---|---|
| JP | 2012002975 A | * | 1/2012 |
| KR | 10-2007-0052151 A | | 5/2007 |
| KR | 10-2008-0034545 A | | 4/2008 |
| KR | 10-2008-0082086 A | | 9/2008 |
| KR | 10-0889682 B1 | | 3/2009 |
| KR | 10-2010-0022738 A | | 3/2010 |
| KR | 10-2012-0056109 A | | 6/2012 |

* cited by examiner

*Primary Examiner* — Ajay K Arora
(74) *Attorney, Agent, or Firm* — Lee & Morse, P.C.

(57) ABSTRACT

An organic light emitting diode display includes a red pixel including a red organic emission layer, a blue pixel including a blue organic emission layer, a green pixel including a green organic emission layer, a main spacer adjacent to the blue pixel, and a sub spacer shorter than the main spacer.

19 Claims, 7 Drawing Sheets

ORGANIC LIGHT EMITTING DIODE DISPLAY

CROSS-REFERENCE TO RELATED APPLICATION

Korean Patent Application No. 10-2013-0123510, filed on Oct. 16, 2013, in the Korean Intellectual Property Office, and entitled: "Organic Light Emitting Diode Display," is incorporated by reference herein in its entirety.

BACKGROUND

1. Field

Embodiments relate to an organic light emitting diode (OLED) display.

2. Description of the Related Art

Flat panel displays include, for example, liquid crystal displays, OLED displays, electrophoretic displays, plasma displays, electrowetting displays, and MEMS displays. The OLED display, in particular, has a self-emission characteristic and thus does not require a separate light source such that a thickness and a weight may be reduced. The OLED display shows high quality characteristics such as low power consumption, high luminance, and high response speed.

SUMMARY

Embodiments are directed to an organic light emitting diode display that includes a red pixel including a red organic emission layer, a blue pixel including a blue organic emission layer, a green pixel including a green organic emission layer, a main spacer adjacent to the blue pixel, and a sub spacer shorter than the main spacer. The cross-sectional area of the sub spacer may be larger than a cross-sectional area of the main spacer. The red pixel and the green pixel may be adjacent to each other in a vertical direction, and the blue pixel may be on one side of the red pixel and the green pixel. The pixels may be in a plurality of columns including a series of alternating first and second columns, the pixels in the first column including only blue pixels and the second column including red and green pixels. The red pixel and the green pixel each may have a larger width than a width of the blue pixel and extend in a horizontal direction, the blue pixel extending in a vertical direction. The main spacer may be on one side of two vertically adjacent blue pixels, and the sub spacer may be between the red pixel and the green pixel. The green pixels may be along a vertical direction and the red pixels and the blue pixels may be respectively on either side of the green pixels.

The red, green, and blue pixels may be plural in number. The red, green, and blue pixels may be in a plurality of columns including a series of alternating first and second columns, the first column including only green pixels and the second column alternatingly including the red pixels or the blue pixels. The green pixels may have the smallest width and the greatest length in the vertical direction, the red pixels may have the largest width and shortest height in the vertical direction, and the blue pixels may have a width intermediate the widths of the red and green pixels, and a length intermediate the lengths of the red and green pixels in the vertical direction. The sub spacer may be below the green pixel and the red pixel in the vertical direction, and the main spacer may be below the blue pixel in the vertical direction.

The red, green, and blue pixels may be plural in number. The red, green, and blue pixels may be in a plurality of rows including a series of alternating first and second rows along a horizontal direction, the first rows may include only green pixels, the second rows alternatingly may include the red pixel or the blue pixels. The two red pixels and two blue pixels may be at four locations in diagonal directions with respect to a location of a particular green pixel. The two red pixels may be opposite to each other with the green pixel at a center therebetween, and the two blue pixels may also be opposite to each other with the green pixel at a center therebetween. The green pixel may have a hexagonal structure and the smallest area, the red pixel and the blue pixel may have a rhombus structure having rounded corners, the blue and red pixels having the same or similar areas to each other. The main spacer and the sub spacer may be plural in number. The main spacers and the sub spacers may be in the second rows, and the main spacers may be on a right side of the blue pixel.

The red pixel, the green pixel, and the blue pixel may be plural in number. The red, green, and blue pixels may be in a plurality of columns in a vertical direction including a series of alternating first, second, and third columns. The pixels of each column may be exclusively red, green, or blue, and each color pixel corresponding to one of the first, second, and third columns. The red pixel, the green pixel, and the blue pixel may have an elongated shape in the vertical direction and the blue pixel may have the largest width of the three color pixels. The sub spacer and main spacer may be plural in number. The sub spacer may be in a column including the green pixels and in a column including the red pixels, and the main spacer may be in a column including the blue pixels.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
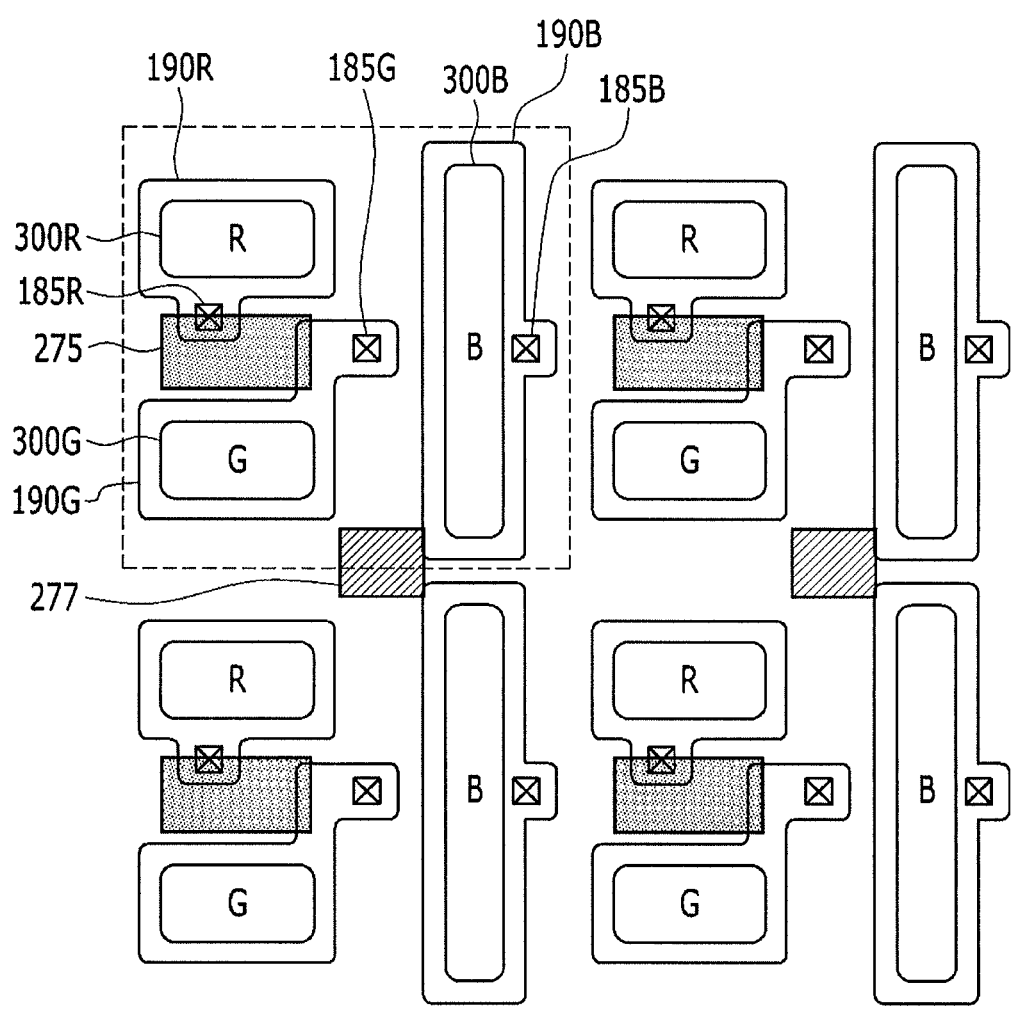
FIG. 1 illustrates a layout view of an OLED display.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. The thickness of layers, films, panels, regions, and the like, may be exaggerated for clarity. Like reference numerals designate like elements throughout the specification. When an element such as a layer, film, region, or substrate is referred to as being "on" another element, it can be directly on the other element or intervening elements may also be present. When an element is referred to as being "directly on"

another element, there are no intervening elements present. Like reference numerals refer to like elements throughout.

An OLED display is described in detail with reference to FIG. 1. FIG. 1 illustrates a layout view of an OLED display. The OLED display may include red, green, and blue pixels. FIG. 1 illustrates a layout (plan) view when, for example, a lower panel of the OLED display may be seen from the top portion. As illustrated in FIG. 1, the OLED display may include a red pixel R, a green pixel G, and a blue pixel B in a unit pixel (illustrated with the dotted line).

Figure 2:
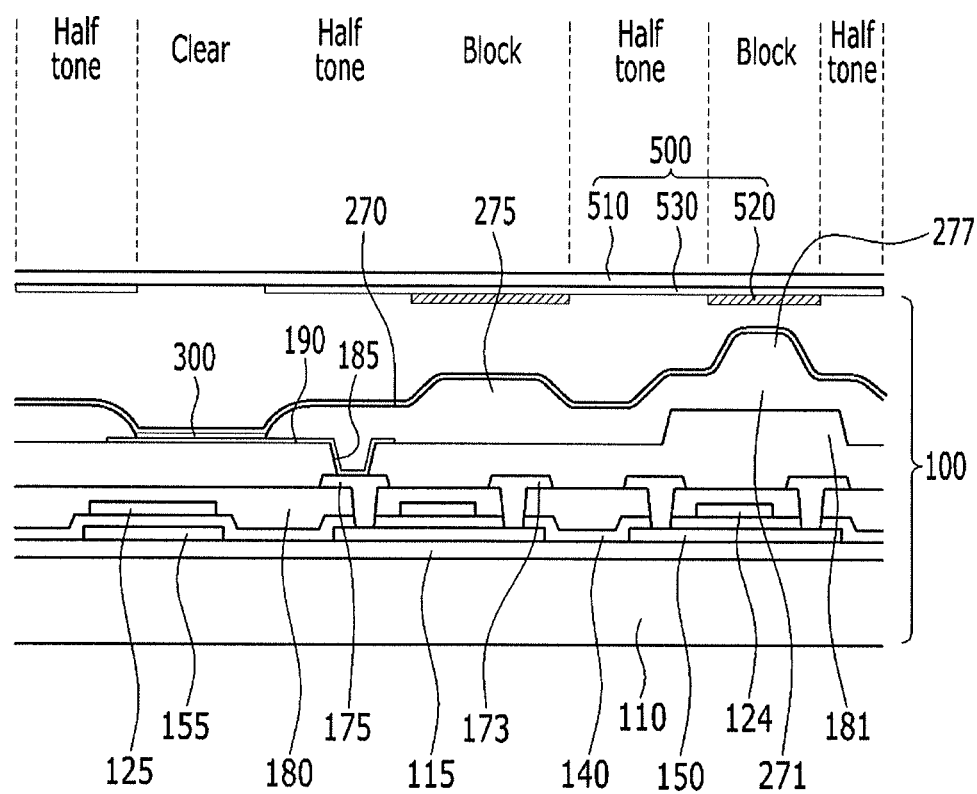
FIG. 2 illustrates a cross-sectional view of an OLED display.

A layout (plan) view of an OLED display, for example, as shown in FIG. 1, can be said to have vertical direction corresponding to a first direction between the top and bottom of the figure and a horizontal direction corresponding to a second direction, perpendicular to the first direction, between the left and right of the figure. The length of an element corresponds to a distance along the first (vertical) direction and the width of a component corresponds to a distance along the second (horizontal) direction. The terms "upwardly" and "downwardly" refer to an extension, respectively, of a component towards the top and bottom of the figure, that is, in the first direction. Extension of a component to the "left" or the "right" refers respectively to the left and right of the figure, that is, in the second direction. In a cross-sectional view, for example, as shown in FIG. 2, the height of a particular component corresponds to a distance from a point, level, reference component, or lowest point of a particular component to the highest point of the particular component in a direction extending towards the top of the figure.

The red pixel R and the green pixel G may be adjacent to each other in a vertical direction and the blue pixel B may be at one side of the red pixel R and the green pixel G. The red pixel R and the green pixel G may have widths that are larger than the blue pixel B, and may extend in a horizontal direction. A width of the blue pixel B may be relatively small and the blue pixel B may extend in a vertical direction. The blue pixels B may be continuous in a column direction and a column (blue pixel column) that includes only blue pixels may be at every two columns. As described herein, a column or row of "continuous" pixels of a particular color may be free of any intervening pixels of a different color. Pixels in such a row or column need not be immediately adjacent to one another. Rather, some amount of space or component(s) other than a pixel may lie between adjacent pixels. The red pixel R and the green pixel G may alternate in the remaining column of the two columns.

In FIG. 1, the red pixel R and the green pixel G may have the same size but the size of the pixels may vary. The red pixel R, the green pixel G, and the blue pixel B with the shown configuration may form one unit pixel (illustrated with the dotted line) and the unit pixels may be arranged in a matrix over the entire display area. The positions of the red pixel R and the green pixel G may be opposite to that shown in FIG. 1. The positions of the red pixel R and the green pixel G between adjacent unit pixels may vary.

Referring to FIG. 1, each pixel may include a pixel electrode 190, a contact hole 185 through which an output of a driving transistor is transmitted to the pixel electrode 190, and an organic emission layer 300 that is defined by an opening of a pixel definition layer (outer portion of 300). A portion that is seen through a boundary as seen from the top portion has been mainly described above and a detailed structure may be described with reference to FIG. 2.

As illustrated in FIG. 1, the red pixel R may include a pixel electrode 190R for a red pixel, a contact hole 185R for a pixel electrode for a red pixel, and a red organic emission layer 300R. The pixel electrode 190R for a red pixel may have a structure that is similar to an outer boundary of the red organic emission layer 300R and may include a structure that downwardly protrudes. A protruding portion of the pixel electrode 190R for a red pixel may be electrically connected to the output of the driving transistor through the contact hole 185R for a pixel electrode for a red pixel.

The green pixel G may include a pixel electrode 190G for a green pixel, a contact hole 185G for a pixel electrode for a green pixel, and a green organic emission layer 300G. The pixel electrode 190G for a green pixel may have a structure that may be similar to an outer boundary of the green organic emission layer 300G and may have a structure that upwardly protrudes. A protruding portion may extend upwardly and then may be bent toward the blue pixel B. An end of the protruding portion of the pixel electrode 190G for a green pixel may be electrically connected to the output of the driving transistor through the contact hole 185G for a pixel electrode for a green pixel.

The blue pixel B may include a pixel electrode 190B for a blue pixel, a contact hole 185B for a pixel electrode for a blue pixel, and a blue organic emission layer 300B. The pixel electrode 190B for a blue pixel may have a structure that is similar to an outer boundary of the blue organic emission layer 300B and may include a structure that protrudes in a right direction. The protruding portion of the pixel electrode 190B for a blue pixel may be electrically connected to the output of the driving transistor through the contact hole 185B for a pixel electrode for a blue pixel.

Spacers 275 and 277 may be between the red pixel R, the green pixel G, and the blue pixel B to maintain a constant interval from an upper substrate. For example, the spacers 275 and 277 may include the same material as the pixel definition layer (outer portion of 300) or may include a material that is different from the pixel definition layer on the pixel definition layer. The spacers 275 and 277 may have different heights. Referring to FIG. 2, a main spacer 277 may have a relatively larger height and a sub spacer 275 may have a relatively smaller height.

The main spacer 277 may have a relatively large height and may have a smaller cross-sectional area than the sub spacer 275. The sub spacer 275 may be lower than the main spacer 277, but may have a larger cross-sectional area than the main spacer 277. The main spacer 277 may be in direct contact with the upper substrate to maintain a constant interval from the upper substrate such that an impact from the outside may be primarily applied to the main spacer 277. The main spacer 277 may have a relatively small cross-sectional area such that if the external impact exceeds a predetermined level, the main spacer 277 may collapse. The sub spacer 275 may prevent the upper substrate from collapsing. Even though the sub spacer 275 may be in contact with the upper substrate only when, for example, the upper substrate is downwardly pressed, the cross-sectional area thereof may be relatively large such that the sub spacer does not collapse by the external impact. Two types of spacers 275 and 277 that have different heights and cross-sectional areas may be used such that an OLED display may better tolerate an external impact.

In FIG. 1, two types of spacers that have different heights and cross-sections are described, but, three or more spacers that have different heights and cross-sections may be provided. In FIG. 1, positions of the spacers 275 and 277 according to an embodiment are illustrated. In FIG. 1, the main spacer 277 may be adjacent to the blue pixel B, the sub spacer 275 may be between the red pixel R and the green pixel G. In FIG. 1, the sub spacer 275 may cover a part of the contact hole 185R for a pixel electrode for a red pixel. The sub spacer 275 may be adjacent to the red pixel R and the green pixel G. The main spacer 277 may be more adjacent to the blue pixel B than to the red pixel R and the green pixel G. The main spacer 277 may be at one side of two blue pixels B that are adjacent in a vertical direction. When the impact is applied from the outside, for example, the main spacer 277 may be pushed toward a surrounding pixel such that the surrounding pixel may be blocked. When the main spacer 277 is adjacent to the blue pixel B such that the blue pixel B is blocked, a display luminance may be less deteriorated and thus a user may not or may barely recognize the deterioration. For example, when the blue pixel B is blocked, the display quality may be less deteriorated than display quality when, for example, the red pixel R or the green pixel G, which may have a higher luminance, are blocked. The positions of the spacers 275 and 277 of FIG. 1 may vary, but the main spacer 277 may be closer to the blue pixel B than the red pixel R and the green pixel G.

A structure of the OLED display and a method that forms two spacers 275 and 277 using one mask are described with reference to FIG. 2. FIG. 2 illustrates a cross-sectional view of an OLED display. Referring to FIG. 2, in a thin film transistor array panel 100 of the OLED display, a blocking layer 115 may be on part of or the entire upper surface of a first substrate 110. The first substrate 110 may include an insulating substrate including glass, quartz, ceramic, metal, or plastic. When the first substrate 110 includes plastic, for example, the OLED display may have a flexible characteristic, a stretchable characteristic, and/or rollable characteristic.

The blocking layer 115 may include silicon oxide or silicon nitride and may be on the first substrate 110. A polycrystalline semiconductor layer 150 that includes a source region, a drain region, and a channel region may be on the blocking layer 115. The blocking layer 115 may improve adhesiveness between the first substrate 110 and the polycrystalline semiconductor layer 150 and may prevent a conductive impurity, which may be present in the first substrate 110, from being diffused onto the polycrystalline semiconductor layer 150 in a crystallization process. A doped semiconductor layer 155 may be on the blocking layer 115. The doped semiconductor layer 155 may have a conductivity similar to a conductor according to a doping concentration.

A gate insulating layer 140 may be on the first substrate 110 that includes the polycrystalline semiconductor layer 150, the doped semiconductor layer 155, and the blocking layer 115. The gate insulating layer 140 may have a contact hole that exposes a source region and a drain region of the polycrystalline semiconductor layer 150. A gate line that extends in one direction and a gate electrode 124 that is the protrusion of a part of gate line may be on the gate insulating layer 140. The gate electrode 124 may overlap the channel region of the polycrystalline semiconductor layer 150. A capacitive electrode 125 may be in a position on the gate insulating layer 140 that corresponds to the doped semiconductor layer 155. The doped semiconductor layer 155 and the capacitive electrode 125 may form a capacitor together with the gate insulating layer 140 therebetween. The capacitor may include constituent elements that are different from those of that described herein.

The gate insulating layer 140, the capacitive electrode 125, and the gate electrode 124 may be covered by a first passivation layer 180. A data line, a source electrode 173 that is connected to the data line, and a drain electrode 175 that is separated from the source electrode 173 may be on the first passivation layer 180. The first passivation layer 180 also may include a contact hole that exposes the source region and the drain region of the polycrystalline semiconductor layer 150 together with the gate insulating layer 140. The source electrode 173 may be in contact with the source region of the polycrystalline semiconductor layer 150 through the contact hole and the drain electrode 175 may be in contact with the drain region of the polycrystalline semiconductor layer 150 through the contact hole.

A second passivation layer 181 may be on the first passivation layer 180, the data line, the source electrode 173, and the drain electrode 175 to cover the first passivation layer 180, the data line, the source electrode 173, and the drain electrode 175. The second passivation layer 181 may have a contact hole that exposes the drain electrode 175 and may include a protruding portion that has a relatively large height. The protruding portion of the second passivation layer 181 may be in a position corresponding to the main spacer 277. A halftone mask 500 illustrated in FIG. 2 may be used to form the protruding portion.

A pixel electrode 190 may be on the second passivation layer 181. The pixel electrode 190 may be in contact with the drain electrode 170 through a contact hole of the second passivation layer 181. The drain electrode 175, which in contact with the pixel electrode 190 may be an output electrode of a driving transistor of the pixel. One pixel may include a plurality of thin film transistors. Among these, a thin film transistor that outputs current to an organic emission layer 300 may be referred to as a driving transistor. A switching transistor that transmits a data voltage to the pixel and a complementary transistor that compensates for an operation of the pixel may be included. A plurality of complementary transistors may be included in one pixel. In the cross-sectional view of FIG. 2, two thin film transistors are illustrated. A thin film transistor that is in contact with the pixel electrode 190 may be a driving transistor and the other thin film transistor may be a switching transistor or a complementary transistor.

A pixel definition film 271 may be on the second passivation layer 181. The pixel definition film 271 may have an opening through which a part of the pixel electrode 190 may be exposed and may have a suitable height serve as spacers 275 and 277. The pixel definition film 271 may have a height of about 0.6 μm or greater, taking into consideration the heights of the spacers 275 and 277. The pixel definition film 271 may be formed using a halftone mask 500 in order to form an opening, a sub spacer 275 that has a relatively small height, and a main spacer 277 that has a relatively large height. The halftone mask 500 is illustrated in an upper portion of FIG. 2. The halftone mask 500 may include a transmissive region 510 through which light is transmitted, a blocking region 520 that blocks light, and a halftone region 530 through which, for example, only partial light is transmitted. The opening of the pixel definition film 271 may be formed by the transmissive region of the halftone mask 500, the spacers 275 and 277 may be formed by the blocking region 520 of the halftone mask 500, and the remaining portion of the pixel definition film 271 may be formed by the halftone region 530 of the halftone mask 500. A light transmittance of the halftone region 530 may be, for example about 30% to about 40%.

Even though the sub spacer 275 and the main spacer 277 are formed by the blocking region 520 of the halftone mask 500, heights thereof may be different from each other due to the protruding portion of the second passivation layer 181 below the main spacer 277. The main spacer 277 may be in a higher position than the sub spacer 275, for example, such that a height of an end of the main spacer may be higher. Heights of portions of the spacers that include the same material as the pixel definition film 271 may be equal to each other.

The organic emission layer 300 may be in the opening of the pixel definition film 271. A common electrode 270 may be on the pixel definition film 271, the spacers 275 and 277, and the organic emission layer 300 to cover the pixel definition film 271, the spacers 275 and 277, and the organic emission layer 300. An opposite substrate may be above the main spacer 277 to shield the organic emission layer 300 from the outside. The opposite substrate may also include an insulating substrate, which may include glass, quartz, ceramic, metal, or plastic. When the opposite substrate includes plastic, for example, the OLED display may have a flexible characteristic, a stretchable characteristic, or a rollable characteristic. In FIG. 2, it is illustrated that a thin film transistor may be below the main spacer 277. In other implementations, the thin film transistor need not be below the main spacer 277.

Figure 3:
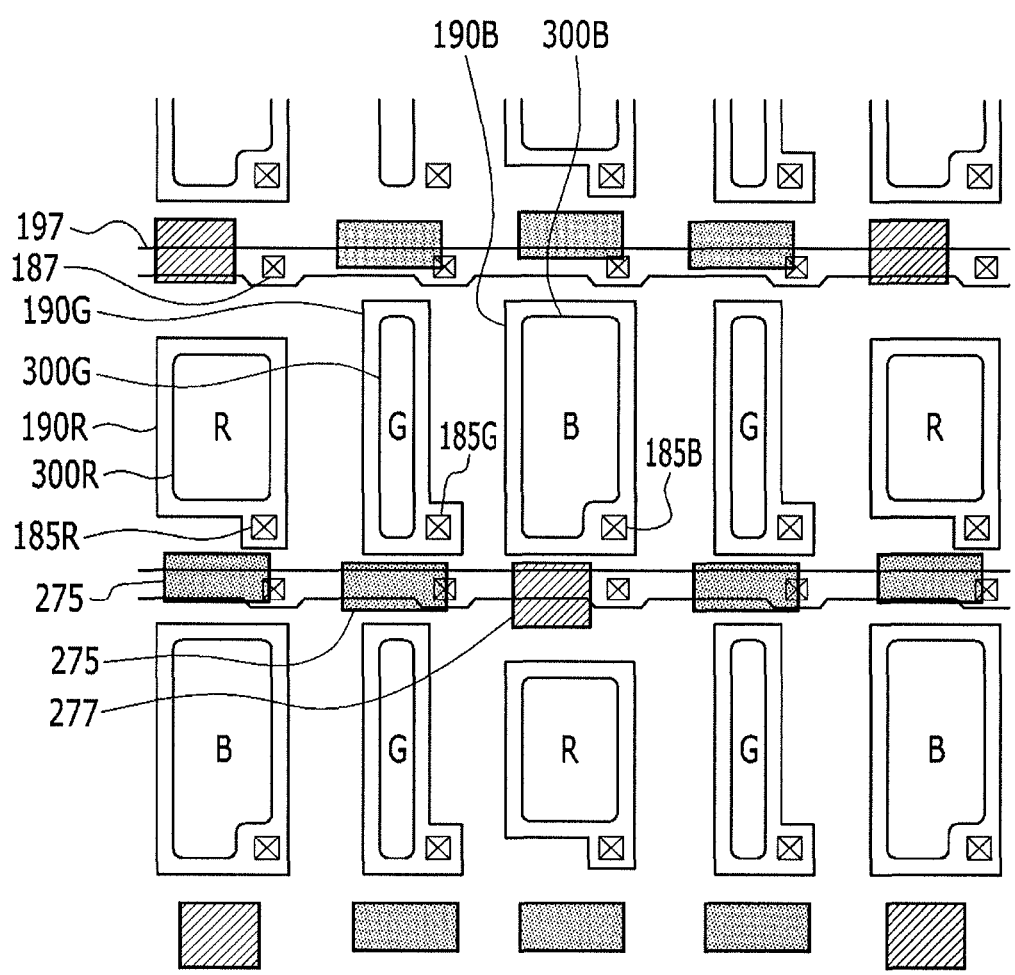
FIGS. 3 to 5 illustrate layout views of an OLED display.
Figure 4:
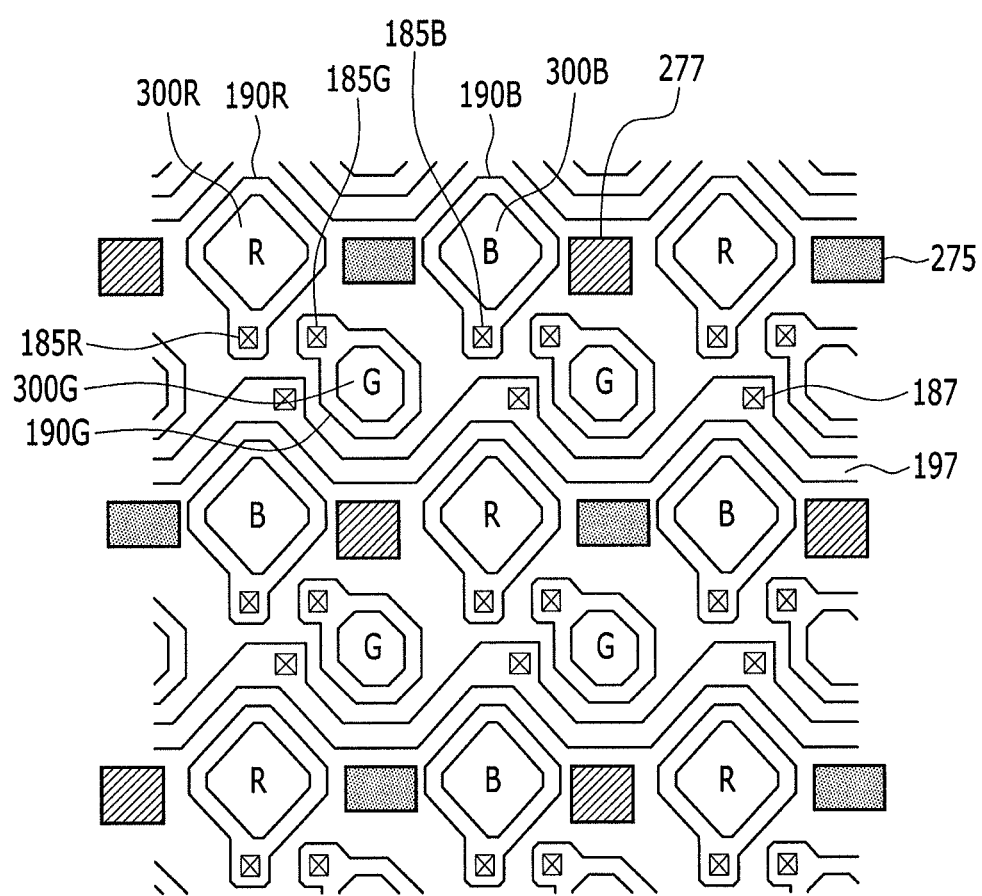
Figure 5:
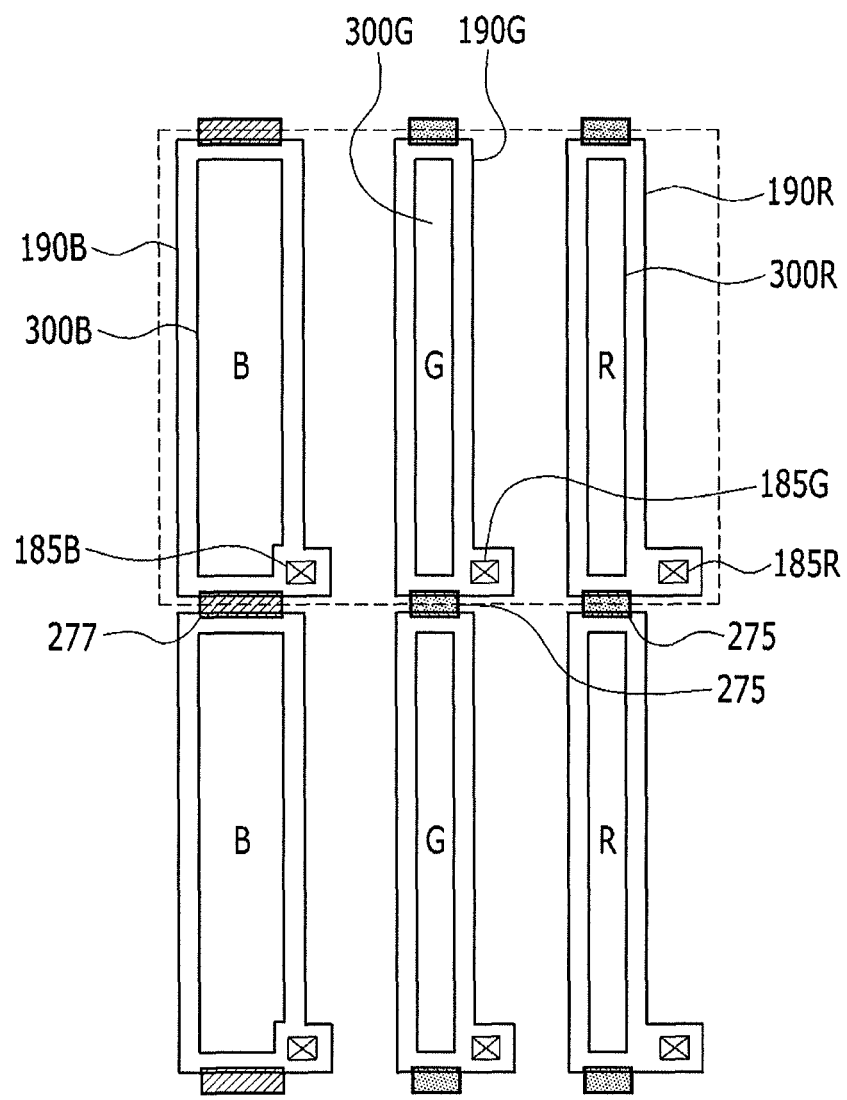

FIGS. 3 to 5 illustrate layout views of an OLED display according to another embodiment. As illustrated in FIG. 3, an OLED display may include a red pixel R, a green pixel G, and a blue pixel B. The green pixels G may be continuous along a vertical direction and the green pixels G may be located at every second column. The red pixels R or the blue pixels B may be located in the remaining column. As described herein, a column or row of "continuous" pixels of a particular color may be free of any intervening pixels of a different color. Pixels in such a row or column need not be immediately adjacent to one another. Rather, some amount of space or component(s) other than a pixel may lie between adjacent pixels. The red pixels R or the blue pixels B may be at both sides of the green pixel G. In the pixel arrangement shown in FIG. 3, the number of red pixels R or the number of blue pixels B may be half the number of green pixels G. If the red pixel R is at a left side of the green pixel G and the blue pixel B are at a right side thereof in one row, the blue pixel B may be at a left side of an upper or lower green pixel G, which may be adjacent to the blue pixel B and the red pixel R may be at a right side thereof. The green pixel G may have a smallest width but may be the longest in the vertical direction and the red pixel R may have a largest width but may be the shortest in the vertical direction. The blue pixel B may have a medium width and a medium length in the vertical direction. The width of the red pixel R may be equal to the width of the blue pixel B or the width of the blue pixel B may be larger than the width of the red pixel R. Even though the number of green pixels G may be twice larger than the number of red pixels R and blue pixels B, colors may be represented through the red pixel R, the green pixel G, and the blue pixel B, which are adjacent to each other.

Referring to FIG. 3, each pixel may include a pixel electrode 190, a contact hole 185 through which an output of a driving transistor is transmitted to the pixel electrode 190, and an organic emission layer 300, which may be defined by an opening of a pixel definition layer (outer portion of 300). A portion is seen through a boundary as seen from the top portion is described herein. The detailed structure may be the same as FIG. 2.

As illustrated in FIG. 3, the red pixel R may include a pixel electrode 190R for the red pixel R, a contact hole 185R for a pixel electrode for the red pixel, and a red organic emission layer 300R. The pixel electrode 190R for a red pixel may have a structure that is similar to an outer boundary of the red organic emission layer 300R and may include a structure that downwardly protrudes. A protruding portion of the pixel electrode 190R for the red pixel R may be electrically connected to the output of the driving transistor through the contact hole 185R for a pixel electrode for the red pixel R.

The green pixel G may include a pixel electrode 190G for a green pixel, a contact hole 185G for a pixel electrode for the green pixel G, and a green organic emission layer 300G. The pixel electrode 190G for the green pixel G may have a structure that may be similar to an outer boundary of the green organic emission layer 300G and may have a structure that protrudes in the right direction. A protruding portion of the pixel electrode 190G for the green pixel G may be electrically connected to the output of the driving transistor through the contact hole 185G for a pixel electrode for the green pixel G.

The blue pixel B may include a pixel electrode 190B for a blue pixel, a contact hole 185B for a pixel electrode for the blue pixel B, and a blue organic emission layer 300B. The pixel electrode 190B for the blue pixel B may have a square structure that is different from an outer boundary of the blue organic emission layer 300B. The blue organic emission layer 300B may have a shape in which a lower right corner is empty or hollow. The contact hole 185B for a pixel electrode for the blue pixel B may be in the hollow portion of the blue organic emission layer 300B and the blue organic emission layer 300B may be electrically connected to the output of the driving transistor though the contact hole 185B.

Spacers 275 and 277 may be between the red pixel R, the green pixel G, and the blue pixel B, and may be configured to maintain a constant interval from an upper substrate. The spacers 275 and 277 may include the same material as the pixel definition layer (outer portion of 300) or may include a material that is different from the pixel definition layer on the pixel definition layer. The spacers 275 and 277 may have different heights. Referring to FIG. 2, the main spacer 277 may have a larger height and a sub spacer 275 may have a smaller height than the main spacer 277. The main spacer 277 may have a relatively large height and may have a smaller cross-section than the sub spacer 275. The sub spacer 275 may be lower than the main spacer 277 but may have a larger cross-section than the main spacer 277. The main spacer 277 may be in direct contact with the upper substrate to maintain a constant interval from the upper substrate such that an impact from the outside may be primarily applied to the main spacer 277. The main spacer 277 may have a relatively small cross-section such that if the external impact exceeds a predetermined level, the main spacer 277 may collapse. The sub spacer 275 may prevent the upper substrate from collapsing. Even though the sub spacer 275 may be in contact with the upper substrate, for example, only when the upper substrate is downwardly pressed, the cross-section thereof may be relatively large such that the sub spacer does not collapse by the external impact. Two types of spacers 275 and 277 that have different heights and cross-sections may be used such that an OLED display, which may better tolerate an external impact.

In FIG. 3, two types of spacers that have different heights and cross-sections have been described. In other implementations, three or more spacers that have different heights and cross-sections may be included. In FIG. 3, the main spacer 277 may be adjacent to the blue pixel B. In FIG. 3, positions of the spacers 275 and 277 are illustrated. The spacers 275 and 277 may be below each pixel in which the main spacer 277 is below the blue pixel B and the sub spacer 275 is below the red pixel R and the green pixel G. The sub spacer 275 may be adjacent to the red pixel R and the green pixel G and the main spacer 277 may be adjacent to the blue pixel B. When the impact is applied from the outside, for example, the main spacer 277 may be pushed to the surrounding such that the surrounding pixel is blocked. The main spacer 277 may be adjacent to the blue pixel B, to block the blue pixel B such that a display luminance may be less deteriorated and, thus, a user may not or may barely recognize the deterioration. Display quality, for example, when the blue pixel B is blocked, may be less deteriorated than display quality, for example, when the red pixel R or the green pixel G that have a high luminance are blocked.

The positions of the spacers 275 and 277 of FIG. 3 may vary, but the main spacer 277 may be closer to the blue pixel B than the red pixel R and the green pixel G. In FIG. 3, a common voltage wiring line 197 may transmit a common voltage between pixel rows. The common voltage wiring line 197 may be electrically connected to the common electrode 270 through the contact hole 187. The common voltage wiring line 197 may be used to help minimize positional variation in voltage applied to the common electrode 270.

As illustrated in FIG. 4, an OLED display may include a red pixel R, a green pixel G, and a blue pixel B. The green pixels G may be continuous along a horizontal direction and the green pixels G may be located every two rows. As described herein, a column or row of "continuous" pixels of a particular color may be free of any intervening pixels of a different color. Pixels in such a row or column need not be immediately adjacent to one another. Rather, some amount of space or component(s) other than a pixel may lie between adjacent pixels. The red pixels R or the blue pixels B may alternately be located in the remaining row. That is, every other row that does not contain green pixels, may contain red or blue pixels. Two red pixels R and two blue pixels B may be at four locations in diagonal directions with respect to the green pixel G. The two red pixels R may be opposite to each other with the green pixel G at a center therebetween, and the two blue pixels B may be also opposite to each other with the green pixel at a center therebetween. In a pixel arrangement shown in FIG. 4, the number of red pixels R or the number of blue pixels B may be half the number of green pixels G. The green pixel G may have, for example, a hexagonal structure and the smallest area. The red pixel R and the blue pixel B may have, for example, a rhombus structure that may have rounded corners and have the same or similar areas to each other. Even though the number of green pixels G may be twice larger that of the red pixels R and blue pixels B, colors may be represented through the red pixel R, the green pixel G, and the blue pixel B, which may be adjacent to each other.

Referring to FIG. 4, each pixel may include a pixel electrode 190, a contact hole 185 through which an output of a driving transistor may be transmitted to the pixel electrode 190, and an organic emission layer 300, which may be defined by an opening of a pixel definition layer (outer portion of 300). A portion seen through a boundary as seen from the top portion is described herein. The detailed structure may be the same as FIG. 2.

As illustrated in FIG. 4, the red pixel R may include a pixel electrode 190R for a red pixel R, a contact hole 185R for a pixel electrode for the red pixel R, and a red organic emission layer 300R. The pixel electrode 190R for the red pixel R may have a structure that may be similar to an outer boundary of the red organic emission layer 300R and may have a structure that downwardly protrudes. A protruding portion of the pixel electrode 190R for the red pixel R may be electrically connected to the output of the driving transistor through the contact hole 185R for a pixel electrode for the red pixel R.

The green pixel G may include a pixel electrode 190G for a green pixel, a contact hole 185G for a pixel electrode for the green pixel G, and a green organic emission layer 300G. The pixel electrode 190G for the green pixel G may have a structure that may be similar to an outer boundary of the green organic emission layer 300G and may have a structure that protrudes to the upper left direction. A protruding portion of the pixel electrode 190G for the green pixel G may be electrically connected to the output of the driving transistor through the contact hole 185G for a pixel electrode for the green pixel G.

The blue pixel B may include a pixel electrode 190B for a blue pixel, a contact hole 185B for a pixel electrode for the blue pixel B, and a blue organic emission layer 300B. The pixel electrode 190B for the blue pixel B may have a structure that may be similar to an outer boundary of the blue organic emission layer 300B and may have a structure that downwardly protrudes. A protruding portion of the pixel electrode 190B for the blue pixel B may be electrically connected to the output of the driving transistor through the contact hole 185B for a pixel electrode for the blue pixel B.

Spacers 275 and 277 may be between the red pixel R, the green pixel G, and the blue pixel B, and may be configured to maintain a constant interval from an upper substrate. The spacers 275 and 277 may include the same material as the pixel definition layer (outer portion of 300) or may include a material that may be different from the pixel definition layer on the pixel definition layer.

The spacers 275 and 277 may have different heights. Referring to FIG. 2, the main spacer 277 may have a larger height and a sub spacer 275 may have a smaller height than the main spacer 277. The main spacer 277 may have a relatively large height and may have a smaller cross-section than the sub spacer 275. The sub spacer 275 may be lower than the main spacer 277, but may have a larger cross-section than the main spacer 277. The main spacer 277 may be in direct contact with the upper substrate to maintain a constant interval from the upper substrate. An impact from the outside may be primarily applied to the main spacer 277. The main spacer 277 may have a relatively small cross-section such that if the external impact exceeds a predetermined level, the main spacer 277 collapses. The sub spacer 275 may prevent the upper substrate from collapsing. For example, even though the sub spacer 275 may be in contact with the upper substrate, only when the upper substrate is downwardly pressed, may the cross-section thereof may relatively large such that the sub spacer does not collapse by the external impact. Two types of spacers 275 and 277 that have different heights and cross-sections allow an OLED display to better tolerate an external impact.

In FIG. 4, two types of spacers that have different heights and cross-sections have been described. However, three or more spacers that have different heights and cross-sections may be included. In FIG. 4, the main spacer 277 may be adjacent to the blue pixel B. In FIG. 4, positions of the spacers 275 and 277 are illustrated. The red pixels R and the blue pixels B may be alternately arranged in the pixel row and spacers 275 and 277 may be between the red pixel R and the blue pixel B. The main spacer 277 may be at a right side of the blue pixel B. Even though the red pixel R may be at the right side of the main spacer 277, a distance to the blue pixel B may be shorter than a distance to the red pixel R. The sub spacer 275 may be at the right side of the red pixel R. The blue pixel B may be, for example, at the right side of the sub spacer 275, and the sub spacer 275 may be, for example, at an exact center between the red pixel R and the blue pixel B.

In FIG. 4, no spacer is shown in the pixel row of the green pixel G. The main spacer 277 may be adjacent to the blue pixel B. When an external impact is applied, for example, the main spacer 277 may be pushed to the surrounding area such that the surrounding pixels are blocked. The main spacer 277 may be adjacent to the blue pixel B to block the blue pixel B such that a display luminance may be less deteriorated and thus a user may not or may barely recognize the deterioration. When the blue pixel B is blocked, for example, display quality may be less deteriorated than when the red pixel R or the green pixel G having a high luminance is blocked.

The positions of the spacers 275 and 277 of FIG. 4 may vary, but the main spacer 277 is closer to the blue pixel B than the red pixel R and the green pixel G. In FIG. 4, a common voltage wiring line 197 may transmit a common voltage between pixel rows. The common voltage wiring line 197 may be below the pixel row of the green pixel G and may be bent along the outer boundary of the green pixel G. The common voltage wiring line 197 may be electrically connected to the common electrode 270 through the contact hole 187. The common voltage wiring line 197 may be used to help minimize positional variation in voltage applied to the common electrode 270.

An OLED display shown in FIG. 5 may include a red pixel R, a green pixel G, and a blue pixel B. The red pixels R, the green pixels G, and the blue pixels B may be continuous along the vertical direction, and one column may include only pixels that have the same color. As described herein, a column or row of "continuous" pixels of a particular color may be free of any intervening pixels of a different color. Pixels in such a row or column need not be immediately adjacent to one another. Rather, some amount of space or component(s) other than a pixel may lie between adjacent pixels. All the red pixels R, the green pixels G, and the blue pixels B may have a structure that may be elongated in the vertical direction. The blue pixel B may have the largest width and the red pixel R, and the green pixel G may have the same or similar widths. The red pixel R, the green pixel G, and the blue pixel B with the illustrated configuration may form one unit pixel (illustrated with the dotted line) and the unit pixels may be arranged in a matrix over the entire display area.

Referring to FIG. 5, each pixel may include a pixel electrode 190, a contact hole 185 through which an output of a driving transistor may be transmitted to the pixel electrode 190, and an organic emission layer 300, which may be defined by an opening of a pixel definition layer (outer portion of 300). A portion that may be seen through a boundary as seen from the top portion is described herein and a detailed structure is described with reference to FIG. 2.

As illustrated in FIG. 5, the red pixel R may include a pixel electrode 190R for a red pixel, a contact hole 185R for a pixel electrode for the red pixel R, and a red organic emission layer 300R. The pixel electrode 190R for the red pixel R may have a structure that may be similar to an outer boundary of the red organic emission layer 300R and may have a structure that protrudes in a right direction. A protruding portion of the pixel electrode 190R for the red pixel R may be electrically connected to the output of the driving transistor through the contact hole 185R for a pixel electrode for the red pixel R.

The green pixel G may include a pixel electrode 190G for a green pixel, a contact hole 185G for a pixel electrode for the green pixel G, and a green organic emission layer 300G. The pixel electrode 190G for the green pixel G may have a structure that may be similar to an outer boundary of the green organic emission layer 300G and may have a structure that protrudes in the right direction. The protruding portion of the pixel electrode 190G for the green pixel G may be electrically connected to the output of the driving transistor through the contact hole 185G for a pixel electrode for the green pixel G.

The blue pixel B may include a pixel electrode 190B for a blue pixel, a contact hole 185B for a pixel electrode for the blue pixel B, and a blue organic emission layer 300B. The pixel electrode 190B for the blue pixel B may have a structure that is similar to an outer boundary of the blue organic emission layer 300B and may have a structure that protrudes in the right direction. The protruding portion of the pixel electrode 190B for the blue pixel B may be electrically connected to the output of the driving transistor through the contact hole 185B for a pixel electrode for the blue pixel B.

Spacers 275 and 277 between the red pixel R, the green pixel G, and the blue pixel B may maintain a constant interval from an upper substrate. The spacers 275 and 277 may include the same material as the pixel definition layer (outer portion of 300) or may include a material that is different from the pixel definition layer on the pixel definition layer. The spacers 275 and 277 may have different heights. Referring to FIG. 2, the main spacer 277 may have a greater height and a sub spacer 75 may have a smaller height than the main spacer 277.

The main spacer 277 may have a relatively large height and may have a smaller cross-section than the sub spacer 275. The sub spacer 275 may be shorter than the main spacer 277 but may have a larger cross-section than the main spacer 277. The main spacer 277 may be in direct contact with the upper substrate to maintain a constant interval from the upper substrate. An external impact may be primarily applied to the main spacer 277. The main spacer 277 may have a relatively small cross-section such that if the external impact exceeds a predetermined level, the main spacer 277 collapses. The sub spacer 275 may prevent the upper substrate from collapsing. For example, even though the sub spacer 275 may be in contact with the upper substrate, only when the upper substrate is downwardly pressed, the relatively large cross-section thereof may prevent the sub spacer from collapsing due to an external impact. Two types of spacers 275 and 277 that have different heights and cross-sections to enable an OLED display to better tolerate an external impact.

In FIG. 5, two types of spacers that have different heights and cross-sections have been described. However, three or more spacers that have different heights and cross-sections may be included. In FIG. 5, the main spacer 277 may be adjacent to the blue pixel B. In FIG. 5, positions of the spacers 275 and 277 are illustrated. In each column, the spacers 275 and 277 may be between pixels. The sub spacer 275 may be in the column of the green pixels G and the column of the red pixels R. The main spacer 277 may be in the column of the blue pixels B.

When an impact is applied from the outside, for example, the main spacer 277 may be pushed to block the surrounding pixel. The main spacer 277 may be adjacent to the blue pixel B to block the blue pixel B such that a display luminance may be less deteriorated and a user may barely recognize the deterioration. Display quality, for example, when the blue pixel B is blocked may be less deteriorated than the display quality, for example, when the red pixel R or the green pixel G having a high luminance may be blocked.

Figure 6:
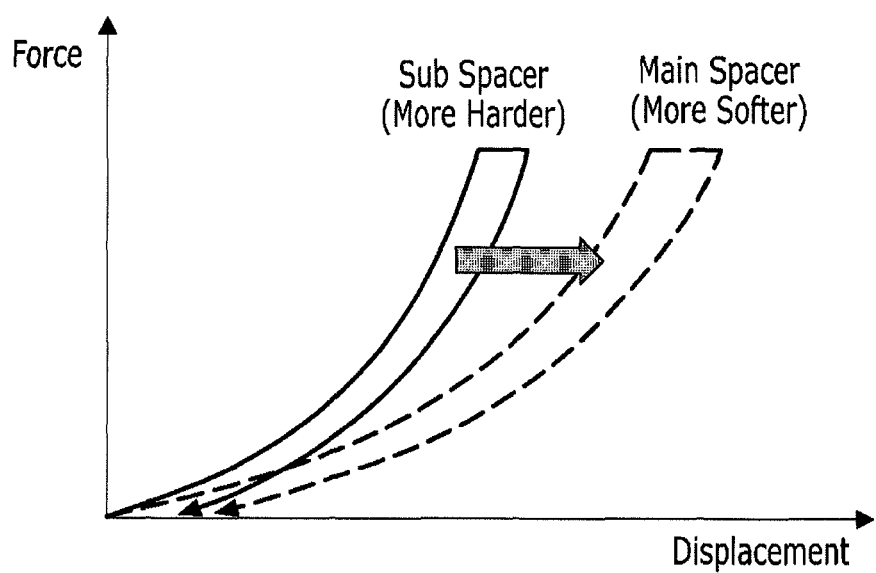
FIG. 6 illustrates a graph of characteristics of spacers having different heights.

The positions of the spacers 275 and 277 of FIG. 5 may vary, but the main spacer 277 may be closer to the blue pixel B than the red pixel R and the green pixel G. A difference of characteristics of the main spacer 277 and the sub spacer 275 may be described with reference to FIG. 6. FIG. 6 illustrates a graph of characteristics of spacers having different heights. The spacers may include a main spacer 277 that is relatively high and has a relatively small cross-section, and may include a sub spacer 275 that is relatively short, and has a relatively large cross-section. Referring to FIG. 6, the displacement of the sub spacer due to a force may be relatively small but displacement of the main spacer due to a force may be relatively large. As a result, the main spacer 277 that supports the opposite substrate may be relatively smooth such that the main spacer 277 collapses due to the external impact. The sub spacer 275 having a relatively small displacement may be provided such that the spacer does not collapse as a whole. For example, the main spacer 277 may be adjacent to the blue pixel B. Even though the main spacer 277 may be pushed due to the external force, the blue pixel B having relatively low luminance is blocked such that the display quality is less deteriorated.

Figure 7:
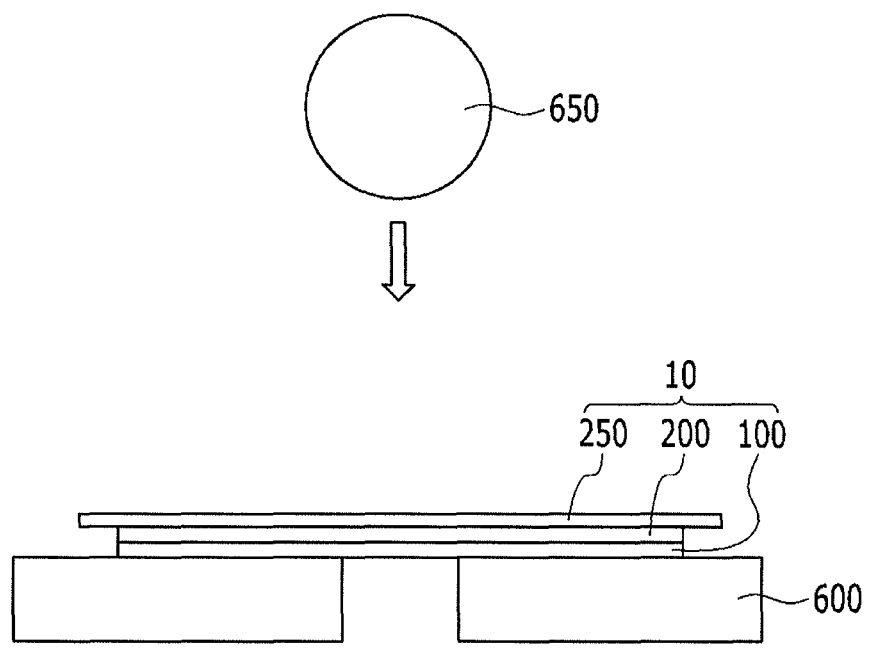
FIG. 7 illustrates a diagram of a test of an impact of an OLED display.

A method of testing an impact of the OLED display is described with reference to FIG. 7. FIG. 7 illustrates a diagram illustrating a test of an impact of an OLED display. An OLED display 10 may include a thin film transistor display panel 100, an opposite substrate 200 that covers the thin film transistor display panel, and a window 250 that covers the opposite substrate 200. A polarizer may be further provided between the opposite substrate 200 and the window. The OLED display 10 including the window 250 may be in a cradle 600 and a pendulum 650 having a predetermined weight may be dropped from a predetermined height from the OLED display 10. The OLED display 10 may be supported by the cradle 600 in a position where the pendulum 650 is dropped so as to bend the OLED display 10. As a result, it may be checked whether the OLED display 10 is bent due to the pendulum 650, which may cause a defect. The weight of the pendulum 650 and a height from which the pendulum 650 may be dropped may vary depending on a purpose of the OLED display 10, and for example, in the case of an OLED display 10 for a portable terminal, the test may be performed while dropping the pendulum 650 having a weight of 500 g from a height of 10 cm or higher.

By way of summation and review, a predetermined or unknown impact from the outside ideally should not deteriorate the display quality of an OLED display. However, such an impact may lower luminance, generate a blurry image, or otherwise compromise display quality, such as, when a substrate of the OLED display is thin or a substrate having a bending characteristic such as plastic is used. As described herein, spacers having different heights may be used to reduce the collapse of spacers. A spacer having a relatively large height, among the spacers, may be adjacent to the blue pixel such that even though the spacer is pushed to block a part of the blue pixel, the luminance may be lowered less and the generation of a blurry image may be reduced such that any deterioration of the display quality is not readily noticeable.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An organic light emitting diode display, comprising:
   a substrate
   a red pixel including a red organic emission layer on the substrate;
   a blue pixel including a blue organic emission layer on the substrate;
   a green pixel including a green organic emission layer on the substrate;
   a main spacer adjacent to the blue pixel on the substrate;
   a sub spacer on the substrate; and
   a passivation layer between the substrate and the main spacer, and between the substrate and the sub spacer, wherein:
   a height of a top surface of the sub spacer from the substrate is smaller than a height of a top surface of the main spacer from the substrate,
   the passivation layer includes a protruding portion protruding toward the top surface of the main spacer in a position corresponding to the main spacer,
   a height of a top surface of the protruding portion is larger than a height of a top surface of a residue position of the passivation layer, and
   the main spacer is closer to the blue pixel than the red and green pixels.

2. The organic light emitting diode display as claimed in claim 1, wherein a top surface area of the sub spacer is larger than a top surface area of the main spacer.

3. The organic light emitting diode display as claimed in claim 2, wherein the red pixel and the green pixel are adjacent to each other in a column direction and the blue pixel is adjacent to the red pixel and the green pixel.

4. The organic light emitting diode display as claimed in claim 3, wherein the red pixel, the blue pixel, and the green pixel are plural in number, the red, blue, and green pixels being in a plurality of columns including a series of alternating first and second columns, the first column including only blue pixels and the second column including red and green pixels.

5. The organic light emitting diode display as claimed in claim 2, wherein the red pixel and the green pixel have larger widths than a width of the blue pixel and extend in a row direction, the blue pixel extending in a column direction.

6. The organic light emitting diode display as claimed in claim 5, wherein the main spacer is adjacent to two adjacent blue pixels in the column direction and the sub spacer is between the red pixel and the green pixel.

7. The organic light emitting diode display as claimed in claim 2, wherein the red pixel, the blue pixel, and the green pixel are plural in number, the green pixels are along a column direction, and the red pixels and the blue pixels are adjacent to the green pixels.

8. The organic light emitting diode display as claimed in claim 7, wherein the red, green, and blue pixels are in a plurality of columns including a series of alternating first and second columns, the first column including only the green pixels and the second column alternatingly including the red pixels and the blue pixels.

9. The organic light emitting diode display as claimed in claim 7, wherein the green, red, and blue pixels have widths in a row direction and lengths in the column direction, the widths of the green pixels smaller than the widths of the blue pixels, the widths of the blue pixels smaller than the widths of the red pixels, the lengths of the green pixels greater than the lengths of the blue pixels, the lengths of the blue pixels greater than the lengths of the red pixels.

10. The organic light emitting diode display as claimed in claim 9, wherein the sub spacers and main spacers are plural in number, the sub spacers are adjacent to the green pixels and the red pixels in the column direction, and the main spacers are adjacent to the blue pixels in the column direction.

11. The organic light emitting diode display as claimed in claim 2, wherein the red pixel, the blue pixel, and the green pixel are plural in number, the red, blue, and green pixels being in a plurality of rows including a series of alternating first and second rows along a row direction, pixels in the first row including only green pixels, the second rows alternatingly including the red pixels and the blue pixels.

12. The organic light emitting diode display as claimed in claim 11, wherein two red pixels and two blue pixels are at four locations in diagonal directions with respect to a location of a particular green pixel.

13. The organic light emitting diode display as claimed in claim 12, wherein the two red pixels are opposite to each other with the green pixel at a center therebetween and the two blue pixels are also opposite to each other with the green pixel at a center therebetween.

14. The organic light emitting diode display as claimed in claim 11, wherein the green pixels have a hexagonal structure and areas smaller than areas of the red and blue pixels, the red pixels and the blue pixels have a rhombus structure having rounded corners, the blue and red pixels having a same area to each other.

15. The organic light emitting diode display as claimed in claim 14, wherein the sub spacers and main spacers are plural in number, and the main spacers and the sub spacers are in the second row, and the main spacers are on a right side of the blue pixels.

16. The organic light emitting diode display as claimed in claim 2, wherein
the red pixel, the blue pixel, and the green pixel are plural in number,
the red pixels are in a first column,
the blue pixels are in a second column, and
the green pixels are in a third column.

17. The organic light emitting diode display as claimed in claim 16, wherein the red pixels, the green pixels, and the blue pixels have an elongated shape in a column direction and the blue pixels have widths larger than widths of the red and green pixels.

18. The organic light emitting diode display as claimed in claim 17, wherein the sub spacers and main spacers are plural in number, and the sub spacers are in the first and third columns, and the main spacers are in the second column.

19. The organic light emitting diode display as claimed in claim 1, wherein the top surface of the sub spacer and the top surface of the main spacer parallel with a top surface of the substrate.

* * * * *